(12) United States Patent  
Fischer et al.

(10) Patent No.: US 11,009,208 B2  
(45) Date of Patent: May 18, 2021

(54) LIGHT SOURCE WITH A PRIMARY LENS MADE OF SILICONE AND A METHOD FOR MANUFACTURING THE LIGHT SOURCE

(71) Applicant: Hella GmbH & Co. KGaA, Lippstadt (DE)

(72) Inventors: Bernd Fischer, Altenbeken (DE); Marc Kaup, Paderborn (DE); Tilman Maucher, Lippstadt (DE); Ingo Möllers, Rietberg (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/315,279

(22) PCT Filed: Jul. 21, 2017

(86) PCT No.: PCT/EP2017/068519  
§ 371 (c)(1),  
(2) Date: Jan. 4, 2019

(87) PCT Pub. No.: WO2018/019726  
PCT Pub. Date: Feb. 1, 2018

(65) Prior Publication Data  
US 2019/0309922 A1 Oct. 10, 2019

(30) Foreign Application Priority Data  
Jul. 28, 2016 (DE) .................... 10 2016 113 942.4

(51) Int. Cl.  
*F21S 41/20* (2018.01)  
*F21S 41/16* (2018.01)  
(Continued)

(52) U.S. Cl.  
CPC ........... *F21S 41/285* (2018.01); *F21S 41/141* (2018.01); *F21S 41/16* (2018.01); *F21S 41/29* (2018.01);  
(Continued)

(58) Field of Classification Search  
None  
See application file for complete search history.

(56) References Cited

U.S. PATENT DOCUMENTS 8,449,128 B2 * 5/2013 Ko ..................... G02B 19/0066  
362/84  
8,598,778 B2 * 12/2013 Allen .................... H01L 33/507  
313/501  
(Continued)

FOREIGN PATENT DOCUMENTS

CN 1538538 A 10/2004  
DE 102007012504 A1 7/2008  
(Continued)

OTHER PUBLICATIONS

International Search Report and Written Opinion dated Oct. 5, 2017 from corresponding PCT Application.

*Primary Examiner* — Elmito Breval  
(74) *Attorney, Agent, or Firm* — Husch Blackwell LLP

(57) ABSTRACT

A light source, specifically an LED or laser diode with a light-emitting surface from which light can be emitted during operation of the light source. An optical element made of transparent material is provided, into which the light emitted by the surface can be beamed. The optical element is molded onto at least one surface formed on the light source using a molding method. A gap is formed between the light-emitting surface and optical element.

9 Claims, 1 Drawing Sheet

(51) Int. Cl.
*F21S 41/141* (2018.01)
*H01L 33/54* (2010.01)
*F21S 41/29* (2018.01)
*H01L 33/56* (2010.01)
*H01L 33/58* (2010.01)

(52) U.S. Cl.
CPC .............. *H01L 33/54* (2013.01); *H01L 33/56* (2013.01); *H01L 33/58* (2013.01); *H01L 2933/005* (2013.01); *H01L 2933/0058* (2013.01)

(56) References Cited

U.S. PATENT DOCUMENTS

| | | | | |
|---|---|---|---|---|
| 8,624,289 | B2* | 1/2014 | Wirth | H01L 33/54 257/100 |
| 2010/0308354 | A1 | 12/2010 | David et al. | |
| 2010/0311193 | A1 | 12/2010 | Lin | |
| 2012/0132944 | A1* | 5/2012 | Hsieh | H01L 33/46 257/98 |
| 2013/0043499 | A1* | 2/2013 | Ohta | H01L 33/483 257/98 |
| 2013/0075154 | A1* | 3/2013 | Saito | C08L 83/04 174/536 |
| 2013/0234274 | A1* | 9/2013 | Kam | H01L 33/58 257/432 |
| 2014/0284652 | A1 | 9/2014 | Shimada et al. | |
| 2014/0286019 | A1 | 9/2014 | Araki et al. | |
| 2015/0145406 | A1* | 5/2015 | Li | F21K 9/232 313/502 |
| 2015/0326767 | A1 | 11/2015 | Kim | |
| 2015/0372204 | A1* | 12/2015 | Matsuoka | H01L 33/483 250/504 R |
| 2017/0152419 | A1* | 6/2017 | Rantala | H01L 23/296 |
| 2017/0261186 | A1* | 9/2017 | Meir | F21V 17/04 |

FOREIGN PATENT DOCUMENTS

| | | |
|---|---|---|
| DE | 10357818 B4 | 10/2009 |
| DE | 102011107892 A1 | 1/2013 |
| DE | 12015001928 T5 | 1/2017 |
| EP | 2075856 A2 | 7/2009 |
| EP | 1934517 B1 | 9/2014 |
| WO | 2007069119 A1 | 6/2007 |
| WO | 2010057019 A2 | 5/2010 |
| WO | 2015164306 A1 | 10/2015 |

* cited by examiner

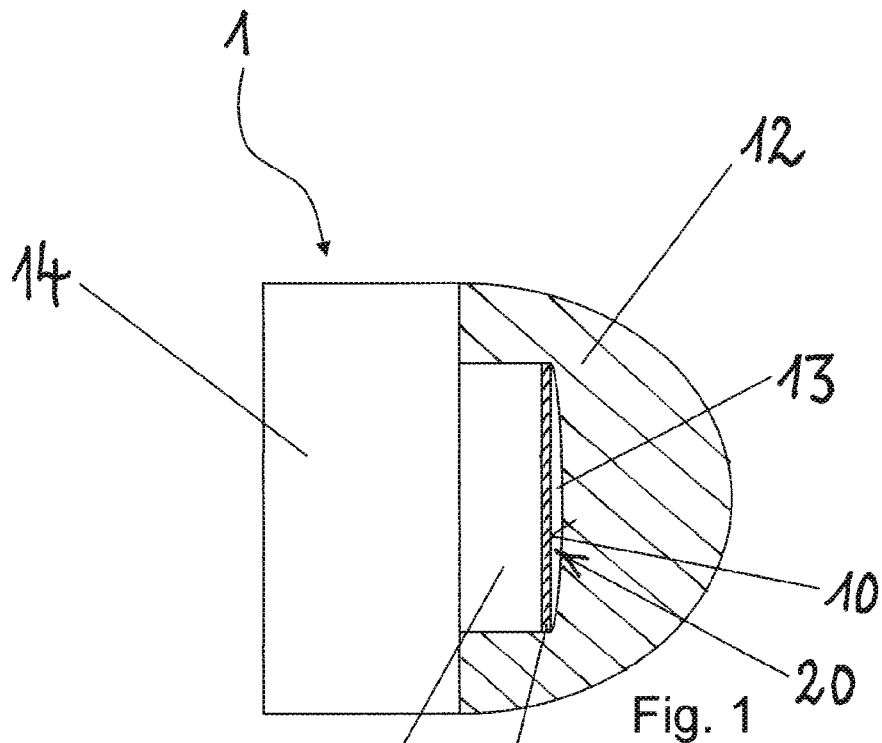
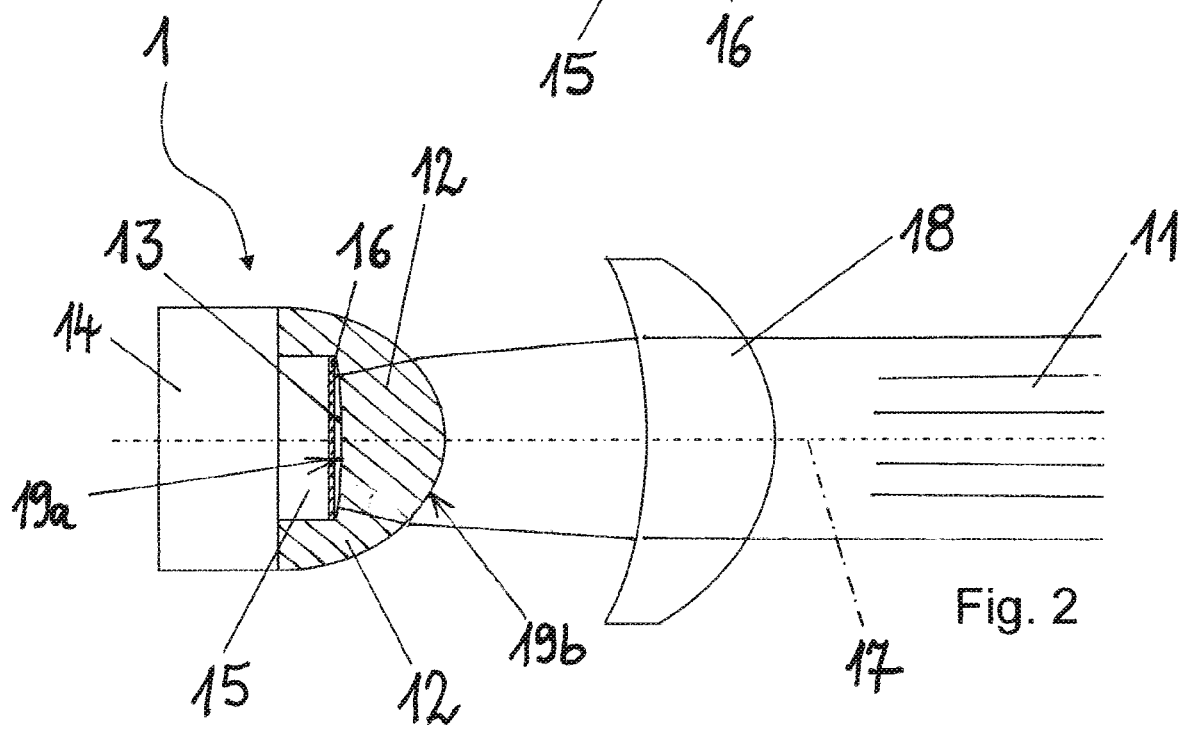

LIGHT SOURCE WITH A PRIMARY LENS MADE OF SILICONE AND A METHOD FOR MANUFACTURING THE LIGHT SOURCE

CROSS REFERENCE

This application claims priority to PCT Application No. PCT/EP2017/068519, filed Jul. 21, 2017, which itself claims priority to German Patent Application 10 2016 113942.4, filed Jul. 28, 2016, the entirety of both of which are hereby incorporated by reference.

FIELD OF THE INVENTION

This inventive object involves a light source, specifically an LED or laser diode for a vehicle lighting device, and a method for manufacturing a light source, with a light-emitting surface from which light can be emitted during operation of the light source, and featuring an optical element made of transparent material into which the light emitted by the surface can be beamed, and where the optical element is molded onto at least one surface formed on the light source using a molding method.

BACKGROUND

As an example, EP 1 934 517 B1 discloses a light source in the form of an LED with a light-emitting surface of an LED chip, which forms a semiconductor body. An optical element for forming a primary lens is attached downstream right above the LED chip. If the light source is put into operation, the LED chip emits light using the light-emitting surface and the light is beamed directly into the optical element. Here, the optical element is injected onto the light source using an injection molding method such that the optical element is positioned, for example, on the semiconductor body and the base body of the light source. For example, the optical element is made of silicone that is transparent and can withstand the temperatures that occur. The light source in the form of the LED is disclosed as part of an automotive headlamp module. Recently, semiconductor light sources have also been used to implement main light functions such as low beam and high beam functions.

DE 10 2011 107 892 A1 discloses an LED with a base body, a semiconductor body and a light-emitting surface formed on the semiconductor body from which light can be emitted during operation of the LED. The embodiments show the method for attaching a transparent optical element made from silicone to a base body of the light source. The technology for applying a coat of silicone makes it clear that there is direct solid contact between the light-emitting surface and light-transparent optical element as the opto-electronic components are immersed in the silicone before it hardens and cures. As a result, the light is emitted from the surface of the semi-conductor body directly into the optical element made of silicone.

The optical elements can also be manufactured using an injection molding method in accordance with EP 2 075 856 A2 and then coupled to the base body and/or semiconductor body. This creates a body cavity between the optical element and the light-emitting surface. However, the advantages of molding the optical element onto at least one surface of the light source can no longer be used.

In addition to the depicted technology for attaching the optical element to the light-emitting surface, in general, injection molding methods for manufacturing the optical element are widely used. The molding process used here generally causes the optical element made from silicone to make direct contact with the light-emitting surface of the semiconductor body or with an emitting layer or converter layer attached to the semiconductor body, specifically a phosphorous layer.

DE 103 57 818 B4 describes a method for manufacturing a light source in the form of an LED with a light-emitting surface from which light can be emitted during operation of the light source. In addition, the light source has an optical element made of transparent material into which the light emitted by the surface can be beamed. The optical element is injected directly onto a surface of the light source to ensure that a direct material connection is formed between the optical element and the light-emitting surface.

Due to the higher refractive index—compared to air—of the light-transparent optical element, which may be made of a thermoplastic or of silicone, for the formation of what is called the primary lens, the spectrum of the decoupled beam of the light source, specifically the LED, changes. This results in a color shift, which has to be taken into account when designing the light source and, if necessary, offset. In order to actually ensure formation of the light, only the refractive boundary layer on the outside of the optical element is provided. The light is decoupled again from the optical element by the refractive boundary layer. When using light sources of this type in vehicle headlamps, secondary lenses are generally used, into which the light that has been decoupled by the refractive boundary layer of the optical element is beamed. The secondary lens forms the beam, where the primary lens generally performs the task of creating a defined light emission area that is smaller than a hemisphere.

SUMMARY OF THE INVENTION

The purpose of the invention is the further embodiment of a light source, specifically an LED or laser diode, which, if possible, prevents the aforementioned color shift from occurring so that taking account of and offsetting a color shift is not required. In particular, a molding method, preferably an injection molding method, should be used to retain the arrangement of the optical element.

Assuming a light source in accordance with the generic concept of claim 1 and assuming a method in accordance with the generic concept of claim 6, this problem is solved by the respective features marked. Additional advantageous improvements to the invention are specified in the dependent claims.

The invention includes the technical contribution that a gap is formed between the light-emitting surface and optical element.

According to the invention, the formation of a gap between the light-emitting surface and optical element prevents a direct coupling of the light from the light-emitting surface into the optical element material. Preferably, the optical element has silicone. However, the transparent material can also include other alternative materials, such as a thermoplastic. There is no color shift caused by the decoupling of the light by the light-emitting surface into a body cavity formed by the gap. From the body cavity, which may be filled with air, the light is coupled into the optical element by a first refractive boundary layer, and after the light passes through the optical element, the light is decoupled from the optical element by a second refractive boundary layer. Both refractive boundary layers are formed on the optical element. According to the invention, the advantages of an injection molding method can continue to be used, particularly as they relate to the simple, firmly bonded connection of the optical element to the light source body and affordable, reproducible manufacturing.

The body cavity formed by the gap between the light-emitting surface and optical element has a base surface that is primarily determined and/or delimited by the light-emitting surface. Specifically, the optical element can be formed from silicone and it can then be ensured that the light emitting diode has a base body and/or a semiconductor body, whereby the surface at the casting of the optical element is preferably attached to the base body and/or semiconductor body. The surface at the casting of the optical element can surround the light-emitting surface on the emitting side of the light source to ensure that the body cavity is closed, which provides a special advantage.

The silicone for forming the optical element can be injected onto the base body and/or semiconductor body using an injection molding method, which provides a special advantage. Consequently, there is no need to do away with the advantages of the use of an injection molding method whereby, according to the invention, measures have to be taken to prevent direct adhesion of the silicone material of the optical element to the light-emitting surface. These measures are described in more detail below in conjunction with the method for manufacturing the light source. Specifically, the light-emitting surface has a siloxane-phobic layer or property that is created using an applied additive (for example), preferably an antiadhesive.

The invention also involves a method for manufacturing a light source, specifically the LED or laser diode, with a light-emitting surface from which the light can be emitted during operation of the light source, and featuring an optical element made of transparent material into which the light emitted by the surface can be beamed, whereby the method includes at least the following steps: providing a base body and/or semiconductor body on which the light-emitting surface is formed (at the very least, indirectly), preventing the transparent material from adhering to the light-emitting surface and molding the transparent material onto the base body and/or semi-conductor body using a molding method for forming the optical element when a gap is formed between the light-emitting surface and optical element.

The application of an additive, specifically a siloxane-phobic layer, onto the light-emitting surface prevents an adhesive effect. It is also conceivable that preventing adhesion using irradiation will result in deactivation of the light-emitting surface.

When protecting against adhesion, the light-emitting surface can be masked, for example, ensuring that the surface is deactivated when the additive is applied right on the location of the light-emitting surface. As such, when silicone is injected onto the base body and/or semiconductor body, a sufficiently large contact face is created for material connection of the silicone to the base body or semiconductor body. In a way, the additive has the opposite effect of a bonding agent, as it effectively prevents the silicone from adhering to the light-emitting surface. A gap of just a few micrometers is sufficient for the body cavity that forms to be made so that it is correspondingly small and flat. When the light-emitting surface is deactivated through irradiation, the properties of the surface change such that it is inert to an adhesive bond to the optical element, specifically to the silicone.

When designing the surface for injecting the optical element, users must be sure to prevent mechanical undercuts. In addition, the selected viscosity of the silicone should not be too low.

Consequently, the gap that has formed creates a closed body cavity between the light-emitting surface and optical element to ensure that there is an additional refractive boundary layer on the optical element and additional light refraction can occur. In this application case for creating the inventive light source, there is an increase in the maximum illumination of the headlamp with this type of light source at an almost identical optical light output ratio.

Another advantage is that the air is still a direct ambient medium of the light source and has a refractive index of n=1. This prevents a change to the emission spectrum of the semiconductor body and the emission layer, which was described above as a color shift. Accordingly, the light color of the light source does not need to be changed at all by modifying the converter material of the emission layer or through a similar process.

The relative position between the light source and primary lens is defined and set by the molding process, where the molding process includes an injection molding step and where depressurized casting methods can be used, which provide a special advantage. This results in an option to manufacture a light source with the primary lens, formed by the optical element, in a low-tolerance and reproducible manufacturing process. There is still the option of performing simple quality control using a camera recording set up at a specific angle at which all the ambient light is reflected off the silicone gap boundary layer.

DESCRIPTION OF THE DRAWINGS

Reference is now made more particularly to the drawings, which illustrate the best presently known mode of carrying out the invention and wherein similar reference characters indicate the same parts throughout the views.

FIG. 1 is a schematic diagram of a light source with the inventive features in the cross section.

FIG. 2 illustrates the light source in accordance with FIG. 1 arranged in front of a secondary lens, where the light is depicted along a main axis of the light.

DETAILED DESCRIPTION OF THE DRAWINGS

FIG. 1 shows a light source 1 in the form of an LED in a cross-section diagram. The light source 1 has a base body 14 to which a semiconductor body 15, which features components such as a printed circuit board, semiconductor emitter, contact and at least a partial plastic overmold, is attached. Electrical contact of the semiconductor body 15 is not shown in more detail. This can, for example, be implemented using the base body 14. An emission layer 16 is applied to a front side of the semiconductor body 15. This layer may include a phosphorous material, for example, in order to attain a desired emission spectrum for the light source 1. The exposed surface of the emission layer 16 forms a light-emitting surface 10 from which light can be emitted during operation of the light source 1.

An optical element 12 that includes a silicone material on the light-emitting side of the light source 1. The optical element 12 is injected onto a front side of the base body 14 and onto the side of the semiconductor body 15 using an injection molding method. Here, the optical body 12 does not adhere to the light-emitting surface 10 such that a gap 13 is formed. By way of illustration, the gap 13 is shown in FIG. 1 to ensure that it can be recognized with a formed body cavity 20. However, the gap 13 may be only a few micrometers, meaning that the depiction of the gap 13 is not to scale.

If the light source 1 is put into operation and light is emitted from the light-emitting surface 10 of the emission layer 16, the light first passes into the gap 13, which is filled with either air or another gas. For example, the filling of the body cavity 20 formed by the gap 13 might have a refractive index of approximately 1 to prevent a color shift from occurring due to direct coupling into the optical element 12. After the light passes through the gap 13, it enters the optical element 12 and exits at the exposed surface of the optical element 12.

FIG. 2 shows the light source 1 with the base body 14, semiconductor body 15 and light-emitting surface 10 on the emission layer 16, where the optical element 12 is arranged above the emission layer 16. After the light 11 passes through the gap 13, it is reflected off the first refractive boundary layer 19a and enters the optical element 12 and is then reflected off the second refractive boundary layer on the opposite side 19b and the light 11 exits the optical element 12. By way of example, a secondary lens 18 is shown that the light 11 also passes through before finally diffusing into the main light axis 17 in a corresponding beam pattern.

In its embodiment, the invention is not limited solely to the preferred embodiment described above. On the contrary, a number of variants that use the solution as represented above are conceivable, even on designs that are fundamentally different. All characteristics resulting from the claims, the description or the drawings and/or advantages, including design details, arrangements in space and process steps can be essential for the invention on their own as well as in any combination.

LIST OF REFERENCE SYMBOLS

1 Light source
10 Light-emitting surface
11 Light
12 Optical element
13 Gap
14 Base body
15 Semiconductor body
16 Emission layer
17 Main axis of the light
18 Secondary lens
19a First refractive boundary layer
19b Second refractive boundary layer
20 Body cavity

The invention claimed is:

1. A light source for a vehicle lighting device, the light source comprising:
   a light-emitting surface from which light is emitted during operation of the light source;
   an optical element made of transparent material into which the light emitted by the surface is beamed,
   wherein the optical element is molded onto at least one surface formed on the light source using a molding method,
   wherein a gap is formed directly between the light-emitting surface and the optical element,
   wherein the light-emitting surface is coated with a siloxane-phobic layer to form an anti-adhesive layer, and
   wherein the gap is formed by the anti-adhesive layer.

2. The light source in accordance with claim 1, wherein the gap forms a closed body cavity over the light-emitting surface.

3. The light source in accordance with claim 2, wherein the body cavity has a base surface that is primarily delimited by the light-emitting surface.

4. The light source in accordance with claim 1, wherein at least one of:
   the optical element is formed from silicone and
   the light emitting diode has at least one of a base body and a semiconductor body, where the surface at the casting of the optical element is attached to the base body or semiconductor body.

5. The light source in accordance with claim 4, wherein the silicone for forming the optical element has been molded onto the base body or onto the semiconductor body using an injection molding method.

6. A method for manufacturing a light source for a vehicle lighting device, with a light-emitting surface from which light can be emitted during operation of the light source and that features an optical element made of transparent material into which the light emitted by the surface can be beamed, where the method includes at least the following steps:
   providing at least one of a base body and/or semiconductor body on which the light-emitting surface is formed;
   preventing the transparent material from adhering to the light-emitting surface;
   molding the transparent material onto the base body or semi-conductor body using a molding method for forming the optical element when a gap is formed directly between the light-emitting surface and optical element; and
   applying an additive including a siloxane-phobic layer onto the light-emitting surface to prevent an adhesive effect and form the gap.

7. The method in accordance with claim 6, wherein adhesive contact is prevented through irradiation, which deactivates the light-emitting surface.

8. The method in accordance with claim 6, wherein the optical element is created by injecting silicone onto the base body or semiconductor body using an injection molding method that forms the transparent material.

9. The method in accordance with claim 6, wherein the gap forms a closed body cavity between the light-emitting surface and optical element.

* * * * *